United States Patent
Shin et al.

(10) Patent No.: US 12,014,991 B2
(45) Date of Patent: *Jun. 18, 2024

(54) INTERCONNECT STRUCTURE INCLUDING GRAPHENE-METAL BARRIER AND METHOD OF MANUFACTURING THE SAME

(71) Applicants: Samsung Electronics Co., Ltd., Suwon-si (KR); SEOUL NATIONAL UNIVERSITY R&DB FOUNDATION, Seoul (KR)

(72) Inventors: Keunwook Shin, Suwon-si (KR); Kibum Kim, Seoul (KR); Hyunmi Kim, Seoul (KR); Hyeonjin Shin, Suwon-si (KR); Sanghun Lee, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/951,474

(22) Filed: Sep. 23, 2022

(65) Prior Publication Data

US 2023/0012899 A1 Jan. 19, 2023

Related U.S. Application Data

(63) Continuation of application No. 16/861,891, filed on Apr. 29, 2020, now Pat. No. 11,508,664.

(30) Foreign Application Priority Data

Apr. 30, 2019 (KR) .......................... 10-2019-0050992
Apr. 28, 2020 (KR) .......................... 10-2020-0051832

(51) Int. Cl.
*H01L 23/538* (2006.01)
*H01L 23/00* (2006.01)
(Continued)

(52) U.S. Cl.
CPC .... *H01L 23/5386* (2013.01); *H01L 23/53204* (2013.01); *H01L 23/5329* (2013.01); *H01L 24/19* (2013.01); *H01L 29/1606* (2013.01)

(58) Field of Classification Search
CPC .......... H01L 23/5386; H01L 23/53204; H01L 23/5329; H01L 24/19; H01L 29/1606
See application file for complete search history.

(56) References Cited

U.S. PATENT DOCUMENTS 7,262,991 B2 8/2007 Zhang et al.
9,324,635 B2 4/2016 Bao et al.
(Continued)

FOREIGN PATENT DOCUMENTS

CN 107538016 A 1/2018
KR 101335714 B1 12/2013
(Continued)

OTHER PUBLICATIONS

Ling Li et al., 'Vertical and Lateral Copper Transport through Graphene Layers' *ACS Nano*, 2015.

*Primary Examiner* — Fernando L Toledo
*Assistant Examiner* — Neil R Prasad
(74) *Attorney, Agent, or Firm* — HARNESS, DICKEY & PIERCE, P.L.C.

(57) ABSTRACT

An interconnect structure may include a graphene-metal barrier on a substrate and a conductive layer on the graphene-metal barrier. The graphene-metal barrier may include a plurality of graphene layers and metal particles on grain boundaries of each graphene layer between the plurality of graphene layers. The metal particles may be formed at a ratio of 1 atom % to 10 atom % with respect to carbon of the plurality of graphene layers.

20 Claims, 5 Drawing Sheets

(51) Int. Cl.
 *H01L 23/532* (2006.01)
 *H01L 29/16* (2006.01)

(56) References Cited

U.S. PATENT DOCUMENTS

| | | | |
|---|---|---|---|
| 11,508,664 B2 * | 11/2022 | Shin | ................ H01L 23/53238 |
| 2008/0169563 A1 | 7/2008 | Awano et al. | |
| 2009/0302365 A1 | 12/2009 | Bhattacharyya | |
| 2014/0029163 A1 | 1/2014 | Lyon et al. | |
| 2014/0197369 A1 | 7/2014 | Sheng et al. | |
| 2018/0233748 A1 | 8/2018 | Zhamu et al. | |
| 2019/0123273 A1 | 4/2019 | Lee et al. | |
| 2019/0267153 A1 | 8/2019 | Kappagantula et al. | |

FOREIGN PATENT DOCUMENTS

| | | |
|---|---|---|
| KR | 20150128056 A | 11/2015 |
| KR | 20190045636 A | 5/2019 |
| WO | WO-2018064137 A1 | 4/2018 |

* cited by examiner

INTERCONNECT STRUCTURE INCLUDING GRAPHENE-METAL BARRIER AND METHOD OF MANUFACTURING THE SAME

CROSS-REFERENCE TO RELATED APPLICATION

This application is a continuation of U.S. application Ser. No. 16/861,891, filed Apr. 29, 2020, which is based on and claims priority under 35 U.S.C. § 119 to Korean Patent Application Nos. 10-2019-0050992, filed on Apr. 30, 2019, and 10-2020-0051832, filed on Apr. 28, 2020 in the Korean Intellectual Property Office, the disclosure of each of which is incorporated by reference herein in its entirety.

BACKGROUND

1. Field

The disclosure relates to interconnect structures including a graphene-metal barrier, electronic devices including a graphene-metal barrier, and methods of manufacturing the same.

2. Description of Related Art

Efforts have been continued to reduce line widths or thicknesses of interconnect structures to manufacture high density and high performance semiconductor devices. When the line width of an interconnect structure is reduced or the thickness thereof is reduced, the number of semiconductor chips to be integrated per wafer may be increased. Also, when the thickness of the interconnect structure is reduced, the capacitance of the line may be reduced, and thus, the sensing margin may be increased in dynamic random access memory (DRAM), etc.

However, when the line width of the interconnect structure is reduced or the thickness thereof is reduced, a resistance of the interconnect structure is increased, and thus, the reduction in resistance of the interconnect structure may be a problem. Current interconnect structure technology is close to a physical limitation area in which specific resistivity is significantly increased as the line width and thickness remarkably decreased.

When an interconnect structure is formed on a substrate, the characteristics of the interconnect structure may be deteriorated and the durability thereof may be reduced due to the diffusion of a material (atoms) of the interconnect structure. To limit and/or prevent these problems, graphene is formed on a substrate and an interconnect structure is formed on the graphene, and thus, the resistance of the interconnect structure may be reduced.

SUMMARY

Provided are interconnect structures including a graphene-metal barrier that prevent atomic diffusion and increase adhesion between layers of the interconnect structures.

Provided are electronic devices to which the interconnect structures are applied.

Provided are methods of manufacturing the interconnect structures capable of simplifying a manufacturing process.

Additional aspects will be set forth in part in the description which follows and, in part, will be apparent from the description, or may be learned by practice of the presented embodiments.

According to an aspect of an embodiment, an interconnect structure including a graphene-metal barrier includes a substrate, a graphene-metal barrier on a substrate, and a conductive layer on the graphene-metal barrier. The graphene-metal barrier includes a plurality of graphene layers and metal particles on a grain boundary of each of the plurality of graphene layers and between the plurality of graphene layers.

In some embodiments, the substrate may include a semiconductor and an insulator.

In some embodiments, the plurality of graphene layers may include three to ten layers of graphene layers.

In some embodiments, the metal particles may include Ru, Al, Ti, Pt, Ta, Rh, Ir, or Co.

In some embodiments, the metal particles may include Ti or Ta, and the metal particles may be metal carbides combined with carbon of at least one of the plurality of graphene layers between grain boundaries.

In some embodiments, the interconnect structure may further include other metal particles between the substrate and the plurality of graphene layers and between the plurality of graphene layers and the conductive layer.

In some embodiments, the metal particles may be formed at a ratio of 1 atom % to 10 atom % with respect to carbon of the plurality of graphene layers.

According to an aspect of an embodiment, a method of manufacturing an interconnect structure including a graphene-metal barrier is provided. The method includes forming the graphene-metal barrier on a substrate and forming a conductive layer on the graphene-metal barrier. The forming the graphene-metal barrier may include supplying a hydrocarbon gas and a metal precursor to the substrate. The graphene-metal barrier may include a plurality of graphene layers and metal particles on a grain boundary of the plurality of graphene layers and between the plurality of graphene layers.

In some embodiments, the forming of the graphene-metal barrier may include simultaneously supplying the hydrocarbon gas and the metal precursor to the substrate.

In some embodiments, the forming the graphene-metal barrier may include repeatedly performing operations of alternately supplying the hydrocarbon gas and the metal precursor to the substrate.

In some embodiments, the forming the graphene-metal barrier may include forming a first graphene layer including a plurality of graphene islands, forming metal particles on graphene grain boundaries of the first graphene layer, and forming a second graphene layer including a plurality of graphene islands over the first graphene layer. The forming the first graphene layer and the forming the second graphene layer may include supplying the hydrocarbon gas to the substrate. The forming metal particles on graphene grain boundaries of the first graphene layer may include supplying the metal precursor to the substrate. The metal particles on the graphene grain boundaries of the first graphene layer may act as catalysts for growing the plurality of graphene islands of the second graphene layer. The plurality of graphene layers may include the first graphene layer and the second graphene layer. The metal particles may be formed between graphene grains in the first graphene layer and the second graphene layer.

In some embodiments, the metal particles may include Ti or Ta, and the metal particles may be metal carbides combined with carbon of a corresponding graphene layer among the plurality of graphene layers.

In some embodiments, the forming the graphene-metal barrier may include forming a structure including the plurality of graphene layers and the metal particles between the plurality of graphene layers, and moving some of the metal particles between the plurality of graphene layers to a grain boundary of the plurality of graphene layer by annealing the structure before forming the conductive layer. Some of the metal particles may cover the grain boundary of plurality of graphene layers.

In some embodiments, the graphene-metal barrier may be formed by using a CVD process.

In some embodiments, the graphene-metal barrier may be formed by using a PECVD process.

According to an aspect of an embodiment, an interconnect structure includes a substrate, a conductive layer on the substrate, and a graphene-metal barrier between the conductive layer and the substrate. The graphene-metal barrier may include a plurality of graphene layers arranged on each other and metal particles. Each of the plurality of graphene layers may include grains separated by grain boundaries. A first portion of the metal particles may be on or in corresponding grain boundaries among the grain boundaries of at least two of the plurality of graphene layers.

In some embodiments, the metal particles may include Ru, Al, Ti, Pt, Ta, Rh, Ir, or Co.

In some embodiments, the substrate may include a semiconductor.

In some embodiments, a second portion of the metal particles may be between adjacent graphene layers among the plurality of graphene layers.

In some embodiments, a third portion of the metal particles may be between the substrate and one of the plurality of graphene layers that is closest to the substrate.

According to an aspect of an embodiment, an electronic device includes an understructure; a barrier on the understructure; and a contact structure on the barrier.

In some embodiments, the barrier may be the graphene-metal barrier of the interconnect structure described above.

In some embodiments, the electronic device may further include an insulating layer on the understructure and including a hole exposing a portion of the understructure.

In some embodiments, the barrier may cover the exposed portion of the understructure and inner side surfaces of the hole, and the hole, the inner side surfaces of which are covered by the barrier may be filled with the contact structure.

In some embodiments, the understructure may be a device portion having a semiconductor region, and the semiconductor region may be exposed through the hole.

In some other embodiments, the understructure may include a material layer on the substrate.

At this point, the material layer may be exposed through the hole.

In some embodiments, the electronic device may further include an electrode layer formed on the insulating layer. The electrode layer covers the hole and contacts the contact structure and the barrier.

In some embodiments, the barrier may extends on the insulating layer around the hole, and the contact structure may extend on the extended portion of the barrier.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
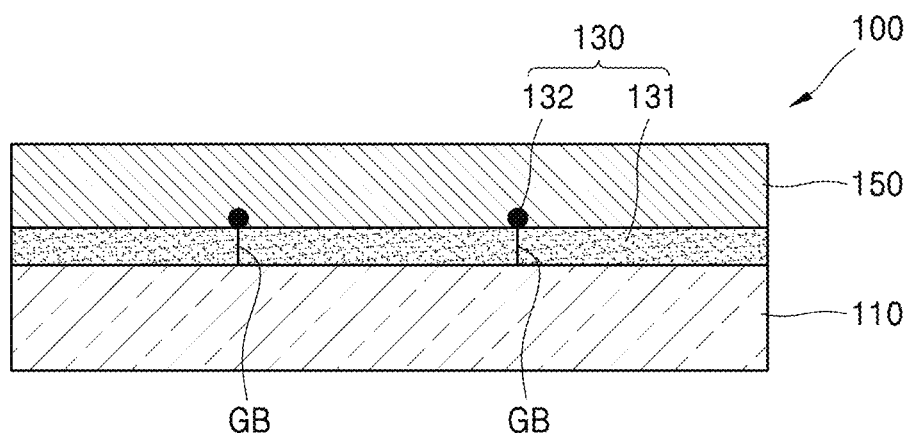
FIG. 1 is a cross-sectional view briefly illustrating a structure of an interconnect structure including a graphene-metal barrier according to an embodiment.

Hereinafter, an interconnect structure including a graphene-metal barrier, an electronic device including a graphene-metal barrier, and a method of manufacturing an interconnect structure according to an embodiment will be described in detail with reference to the accompanying drawings. In the drawings, thicknesses of layers and regions may be exaggerated for clarity of the specification. The embodiments of the inventive concept are capable of various modifications and may be embodied in many different forms.

It will be understood that when an element or layer is referred to as being "on" or "above" another element or layer, the element or layer may be directly on another element or layer or intervening elements or layers.

The singular forms "a," "an" and "the" are intended to include the plural forms as well, unless the context clearly indicates otherwise.

Also, when a region "includes" an element, the region may further include another element instead of excluding the other element, unless otherwise differently stated.

In the specification (especially, in the claims) the term "above" and similar directional terms may be applied to both singular and plural.

With respect to operations that constitute a method, the operations may be performed in any appropriate sequence unless the sequence of operations is clearly described or unless the context clearly indicates otherwise. The operations may not necessarily be performed in the order of sequence. All examples or example terms (for example, etc.) are simply used to explain in detail the technical scope of the inventive concept, and thus, the scope of the inventive concept is not limited by the examples or the example terms as long as it is not defined by the claims.

FIG. 1 is a cross-sectional view briefly illustrating a structure of an interconnect structure 100 including a graphene-metal barrier according to an embodiment.

Referring to FIG. 1, the interconnect structure 100 includes a graphene-metal barrier 130 on a substrate 110 and a conductive layer 150 on the graphene-metal barrier 130. The substrate 110 may include an insulating material or a semiconductor material, or a semiconductor-on-insulator (SOI) substrate, or may be an insulating material substrate, a semiconductor material substrate, or an SOI substrate. The insulating material may include silicon oxide, nitride, silicon nitride, silicon carbide, silicate, etc. However, this is an example, and the substrate 110 may include various insulating materials besides the above materials.

The semiconductor material may include a Group IV semiconductor material, a Group III/V semiconductor compound, or a Group II/VI semiconductor compound. As a specific example, the substrate 110 may include Si, Ge, SiC, SiGe, SiGeC, Ge Alloy, GaAs, InAs, InP, etc. However, this is an example, and the substrate 110 may include various other semiconductor materials besides the above materials.

However, the present embodiment is not limited thereto. In some embodiments, the substrate 110 may include a conductive material. The substrate 110 may be a base for forming an interconnector.

The graphene-metal barrier 130 may be configured as a diffusion barrier to limit and/or prevent the material of the conductive layer 150 from moving to the substrate 110. The graphene-metal barrier 130 may include a graphene layer 131 and metal particles 132. The graphene layer 131 may include three to ten graphene layers, but is not limited thereto. The graphene layer 131 may include a crystalline graphene layer directly grown on the substrate 110. The graphene layer 131 may have a relatively large number of defects, low electron mobility, and low carrier concentration, thereby resulting in high resistance. The graphene layer 131 includes crystal grains. The crystal grains may have a diameter in a range from about 1 nm to about 100 nm. A grain boundary GB may be formed between the grains.

The metal particles 132 may be a cluster of metal atoms of the conductive layer 150. The metal atoms may include Ru, Al, Ti, Pt, Ta, Rh, Ir, Co, etc. The metal particles 132 may increase the electrical conductivity of the graphene layer 131.

The conductive layer 150 may include a metal or a metal alloy having a high electrical conductivity. For example, the conductive layer 150 may include Cu, Ru, Al, Co, W, Mo, Ti, Ta, Ni, Pt, Cr, Rh, Ir, or an alloy of these metals. However, the present embodiment is not limited thereto, and the conductive layer 150 may include various other metals.

Figure 2:
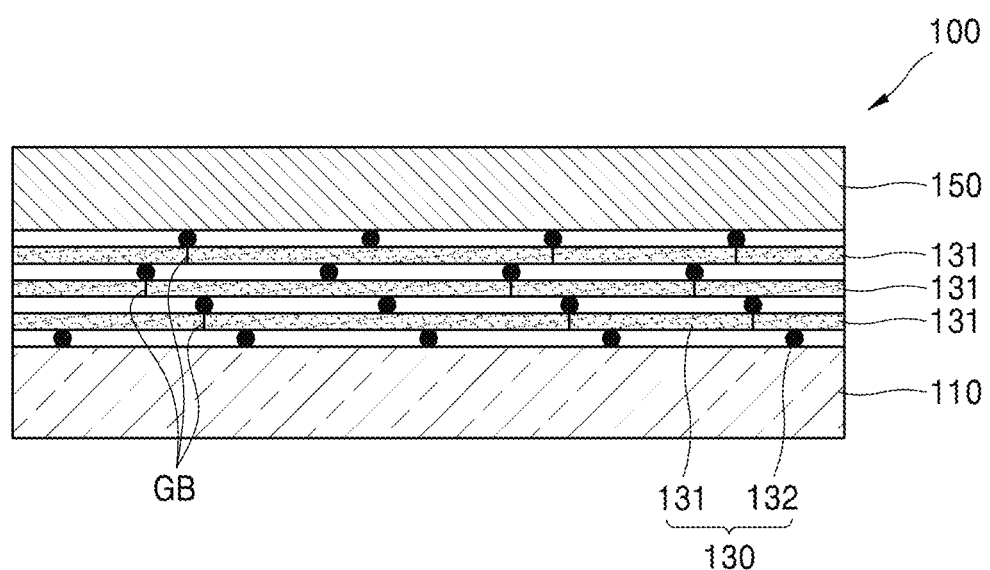
FIG. 2 is a cross-sectional view showing example locations of metal particles in an interconnect structure including a graphene-metal barrier according to an embodiment.

FIG. 2 is a cross-sectional view showing example locations of metal particles 132 in an interconnect structure 100 including the graphene-metal barrier 130 according to an embodiment. Like reference numerals are used to indicate elements that are substantially identical to the elements of FIG. 1, and the detailed descriptions thereof will be omitted.

Referring to FIG. 2, three graphene layers 131 are arranged between the substrate 110 and the conductive layer 150. Each graphene layer 131 includes a plurality of grains separated by grain boundaries GB. For example, each graphene layer 131 may include grains having a grain size in a range from about 1 nm to about to 100 nm. The metal particles 132 may be formed on and sides of the grain boundary GB of the graphene layer 131, between the substrate 110 and the graphene layer 131, between the graphene layers 131, and/or between the graphene layer 131 and the conductive layer 150. Metal particles 132 of Ti and Ta may form TiC and TaC metal carbide by combining with carbon of the graphene between the graphene grain boundaries GB. The metal particles 132 of TiC and TaC may be catalytic materials for growing other graphene grains.

The metal particles 132 may increase the adhesiveness of contacting layers according to positions. For example, the metal particles 132 may increase the adhesiveness between the substrate 110 and the graphene layer 131, between the graphene layers 131, and the graphene layer 131 and the conductive layer 150 according to positions. Also, the metal particles 132 may provide a doping effect of the graphene layer 131, and thus, may increase the electrical conductivity of the graphene layer 131.

Figure 3:
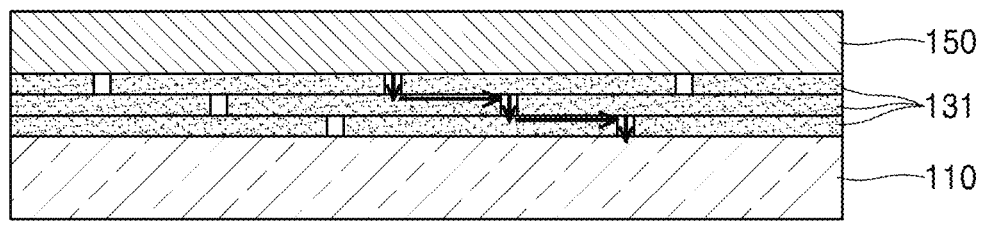
FIG. 3 is a cross-sectional view for explaining the diffusion of metal atoms in a graphene barrier that lacks metal particles.

FIG. 3 is a cross-sectional view for explaining the diffusion of metal atoms in the graphene barrier that lacks the metal particles 132. Like reference numerals are used to indicate elements that are substantially identical to the elements of FIG. 2, and thus, the detailed description thereof will be omitted.

Referring to FIG. 3, the metal atoms of the conductive layer 150 may be diffused into the substrate 110 through interfaces between the grain boundaries GB of the graphene layer 131 and between the graphene layers 131.

The metal particles 132 of the interconnect structure 100 according to the embodiment are formed on the grain boundary GB of the graphene layer 131 to limit and/or prevent the metal atoms of the conductive layer 150 from diffusing into the substrate 110. The interconnect structure 100 may perform as a diffusion barrier film.

The amount of the metal particles 132 may be formed so that metals atoms of the metal particles 132 are in a range from 1 atom % to 10 atom % with respect to the number of carbon atoms of the graphene layer 131. When a ratio of the metal atoms is less than 1 atom % with respect to the number of carbon atoms of the graphene layer 131, the amount of metal atoms between the substrate 110 and the graphene layer 131, between the graphene layers 131, and between the conductive layer 150 and the graphene layer 131 is small, and thus, the effect of limiting and/or preventing the diffusion of atoms is reduced and it is difficult to contribute to the increase in the adhesiveness of the interconnect structure 100. When the ratio of the metal atoms with respect to the number of carbon atoms of the graphene layer 131 is greater than 10 atom %, the amount of metal atoms between the substrate 110 and the graphene layer 131, between the graphene layers 131, and between the conductive layer 150 and the graphene layer 131 is too much, and thus, the barrier effect by graphene in the interconnect structure 100 may be reduced.

Figure 4:
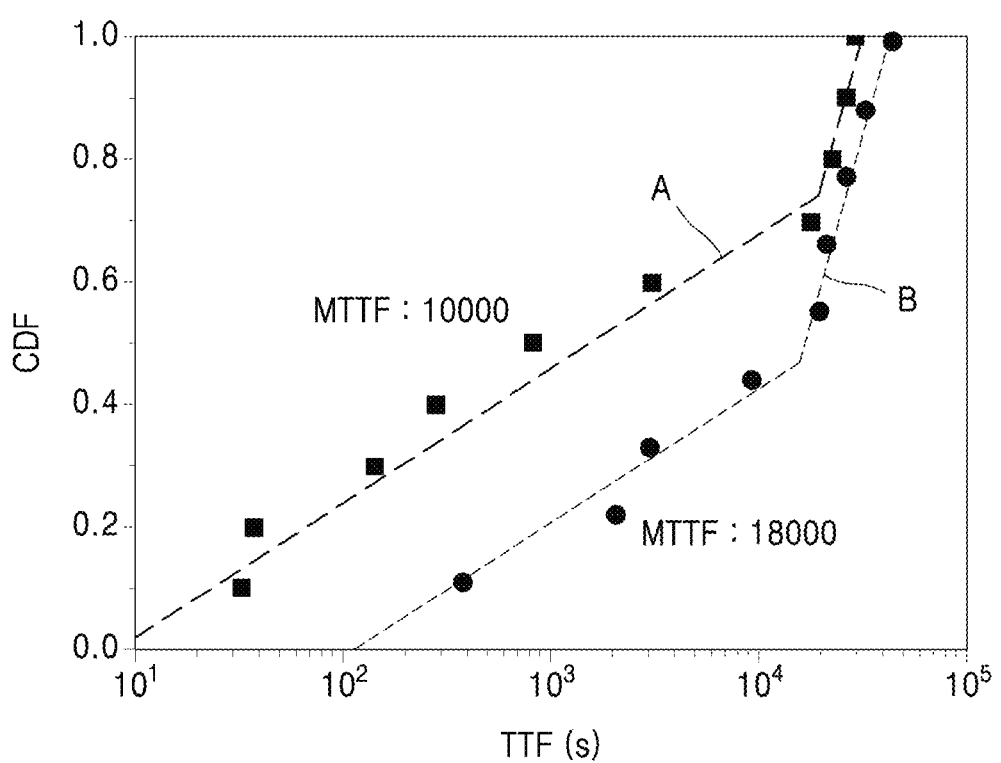
FIG. 4 is a graph showing the barrier effect of an interconnect structure including a graphene-metal barrier according to an embodiment.

FIG. 4 is a graph showing the barrier effect of the interconnect structure 100 including the graphene-metal barrier 130 according to an embodiment. Curve A shows the characteristics of the interconnect structure 100 not including metal particles 132 and curve B shows a characteristic curve of the interconnect structure 100 according to an embodiment. The horizontal axis represents a time to failure (TTF) and the vertical axis represents a cumulative density function (CDF). In FIG. 4, mean time to failures (MTTF) denotes an average time from the first use of the interconnect structure 100 to the occurrence of a failure.

Referring to FIG. 4, compared to the interconnect structure (curve A) including a graphene layer barrier that lacks the metal particles 132, when the metal atoms are formed on the graphene layer 131 (curve B), a duration time until a failure occurrence is greatly improved This is interpreted as that the diffusion of metal atoms through the grain boundary GB of the graphene layer 131 is limited and/or blocked by the metal particles 132 of the graphene-metal barrier 130.

According to the interconnect structure 100 including the graphene-metal barrier 130 according to an embodiment, the metal diffusion is interrupted since the metal particles 132 limit and/or block the grain boundary GB of the graphene layer 131, and thus, the increase in the resistance of the conductive layer 150 is reduced, and consequently, the conductivity of the interconnect structure 100 may be increased.

Also, the metal particles 132 between the substrate 110 and the graphene layer 131, between the graphene layers 131, and between the conductive layer 150 and the graphene layer 131 increase the adhesiveness between these layers.

The interconnect structure 100 according to the present embodiment may be applied to connections between interconnects in an electronic device.

At this point, the electronic device includes a plurality of elements, and the plurality of elements include at least one of a transistor, a capacitor, and a resistor, and the interconnect structure 100 may be used to connect the plurality of elements or to connect parts within each of the elements.

Figure 5A:
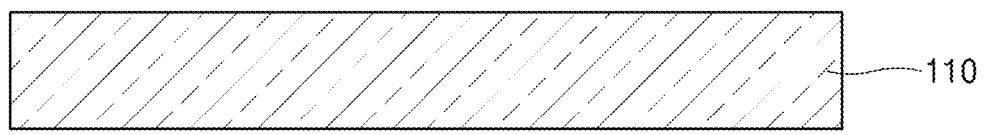
FIGS. 5A through 5C are schematic cross-sectional views showing a method of manufacturing an interconnect structure including a graphene-metal barrier, according to an embodiment.
Figure 5B:
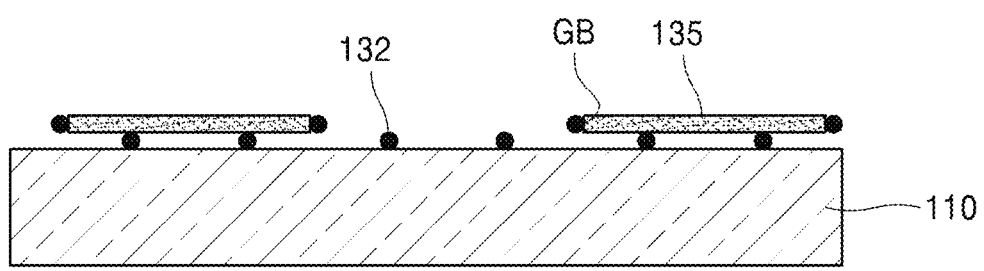
Figure 5C:
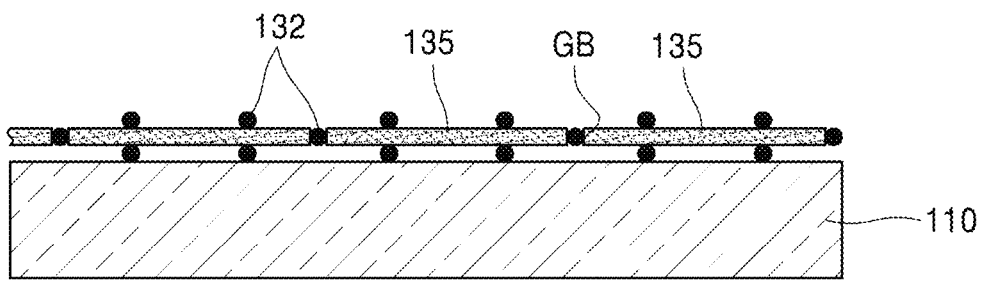

FIGS. 5A through 5C are schematic cross-sectional views showing a method of manufacturing the interconnect structure 100 including the graphene-metal barrier 130, according to an embodiment. The interconnect structure 100 described with reference to FIG. 1 may be manufactured through the processes of FIGS. 5A through 5C.

Referring to FIG. 5A, the substrate 110 is formed in advance. The substrate 110 may include an insulating material or a semiconductor material, or a semiconductor-on-insulator substrate. The insulating material may include silicon oxide, nitride, silicon nitride, silicon carbide, silicate, etc. However, this is an example, and the substrate 110 may include various other semiconductor materials besides the above materials.

The semiconductor material may include a Group IV semiconductor material, a Group III/V semiconductor compound, or a Group II/VI semiconductor compound. As a specific example, the substrate 110 may include Si, Ge, SiC, SiGe, SiGeC, Ge Alloy, GaAs, InAs, InP, etc. However, this is an example, and the substrate 110 may include various other semiconductor materials besides the above materials.

However, the present embodiment is not limited thereto. In some embodiments, the substrate 110 may include a conductive material. The substrate 110 may be a base for forming an interconnector.

Referring to FIG. 5B, the graphene-metal barrier 130 (refer to FIG. 2) is formed on the substrate 110. The substrate 110 is placed into a chemical vapor deposition (CVD) chamber (not shown). For example, the substrate 110 may be placed into a plasma-enhanced chemical vapor deposition (PECVD) chamber (not shown). A hydrocarbon gas and a metal precursor are supplied into the CVD chamber. A continuous graphene layer 131 may be directly grown on the substrate 110 at a temperature in a range from about 400° C. to about 500° C. without a catalyst metal. The graphene layer 131 may include a crystalline graphene layer 131 of three to ten layers. Each graphene layer 131 may include grains having diameters in a range from 1 nm to 100 nm.

The hydrocarbon gas may include $CH_4$, $C_2H_2$, etc.

The metal precursor may be a precursor including Ru, Al, Ti, Pt, Ta, Rh, Ir, and Co. For example, the metal precursor may include Ruthenium carbonyl as a Ru precursor, Trimethylaluminium (TMA) or Triethylaluminium (TEA) as an Al precursor, Titanium isopropoxide or Titanium ethoxide as a Ti precursor, Platinum hexafluoroacetylacetonate as a Pt precursor, and Tantalum tetraethoxy (acetylacetonate) as a Ta precursor.

The flow rate of the hydrocarbon gas supplied into the CVD chamber and the flow rate of the metal precursor may differ depending on a CVD method. The flow rate of hydrocarbon gas and the flow rate of the metal precursor may be controlled such that metal atoms of the metal particles 132 in the graphene-metal barrier 130 are formed at a ratio of 1 atom % to 10 atom % with respect to the carbon atoms of the graphene layer 131. When the ratio of metal atoms is less than 1 atom % with respect to the number of carbon atoms of the graphene layer 131, the amount of metal atoms between the substrate 110 and the graphene layer 131, between the graphene layers 131, and between the conductive layer 150 and the graphene layer 131 is small, and thus, the effect of limiting and/or preventing the diffusion of atoms is reduced and it is difficult to contribute to the increase in the adhesiveness of the interconnect structure 100. When the ratio of the metal atoms with respect to the number of carbon atoms of the graphene layer 131 is greater than 10 atom %, the amount of metal atoms between the substrate 110 and the graphene layer 131, between the graphene layers 131, and between the conductive layer 150 and the graphene layer 131 is too much, and thus, the barrier effect by graphene in the interconnect structure 100 may be reduced.

For example, when a PECVD process is used, the flow rate of Tantalum (tetraethoxy) (acetylacetonate) may be supplied in a range of about 5% to 50% with respect to the flow rate of $C_2H_2$ gas.

According to the present embodiment, the metal particles 132 may be formed on the graphene layer 131 by using the metal precursor simultaneously supplied while forming the graphene layer 131 through the supply of hydrocarbon. When the supply time of the hydrocarbon and the metal precursor is controlled, the graphene layer 131 of multiple layers may be formed. The graphene layer 131 of three to ten layers may be formed. During the formation of the graphene layer 131, the metal particles 132 may block the grain boundary GB of the graphene layer 131.

However, the present embodiment is not limited thereto. For example, the supply time of the hydrocarbon gas and the supply time of the metal precursor may alternatively be performed. The supply time of the hydrocarbon gas may be a time for forming the graphene layer 131 of the first layer or less.

Referring to FIG. 5B again, a plurality of graphene islands 135 may be formed by the supply of hydrocarbon gas, and the metal particles 132 may be formed in the graphene grain boundary GB or upper and lower surfaces of the graphene islands 135 by the supply of the metal precursor.

Referring to FIG. 5C, when the hydrocarbon gas and the metal precursor are continuously supplied, the metal particles 132 formed in the graphene grain boundary GB may perform as catalysts for growth of the other graphene islands 135. As a result, the graphene layer 131 of a single-layer may be formed, and the metal particles 132 may be formed on the graphene grain boundary GB and on the graphene layer 131. When a Ti precursor and a Ta precursor are used, the Ti and Ta metal particles 132 may form TiC and TaC metal carbide by respectively combining with carbons of the graphene islands 135.

When the processes described with reference to FIGS. 5B and 5C are repeated, a plurality of graphene layers 131 (refer to FIG. 2) may be formed on the substrate 110. Each of the graphene layers 131 includes crystal grains, and interfaces between the grain boundaries GB may be filled with metal particles 132. The metal particles 132 between the graphene layer 131 and the substrate 110 may increase the adhesiveness between the substrate 110 and the graphene layer 131. The metal particles 132 between the graphene layers 131 may increase the adhesiveness between the graphene layers 131. The metal particles 132 covering the grain boundary GB on the graphene layers 131 may increase the adhesiveness with the conductive layer 150 formed thereon.

Next, the resultant product may be annealed at a temperature in a range from about 400° C. to 500° C. for a desired (and/or alternatively predetermined) time, for example, a few seconds to a few minutes. As a result of the annealing, the metal particles 132 between the graphene layers 131 may be moved to the grain boundary GB of the graphene layer 131, and the energy level of the metal particles 132 may be stabilized. During the annealing process, the supply of the hydrocarbon gas and the metal precursor is stopped.

The conductive layer 150 (refer to FIG. 1) is formed on the graphene layers 131. The conductive layer 150 may include a metal or a metal alloy having a high electrical conductivity. For example, the conductive layer 150 may include Cu, Ru, Al, Co, W, Mo, Ti, Ta, Ni, Pt, Cr, Rh, Ir, or an alloy of these metals. However, the present embodiment is not limited thereto, and the conductive layer 150 may include various other metals.

The conductive layer 150 may be formed by using, for example, a CVD method, a PECVD method, a physical vapor deposition (PVD) method, an electroplating method, a chemical solution deposition method, an electroless plating method, etc.

In the method of manufacturing the interconnect structure 100 including the graphene-metal barrier 130 according to an embodiment, the metal particles 132 are simultaneously formed between graphene grains while forming graphene, thereby simplifying the manufacturing process.

According to the embodiment, since the metal particles cover the grain boundary of the graphene layer, the diffusion of elements of the conductive layer is limited and/or prevented, and thus, the deterioration of the conductivity of the conductive layer is limited and/or prevented, and accordingly, a usage time of the interconnect structure without failure may be increased.

The metal particles may increase the adhesiveness between contacting layers, for example, between the substrate and the graphene layer, between the graphene layers, and between the graphene layer and the conductive layer depending on positions.

Also, the metal particles bring about a doping effect of the graphene layer, and thus, may increase the electrical conductivity of the graphene layer.

In the method of manufacturing the interconnect structure including the graphene-metal barrier according to an embodiment, the metal particles are simultaneously formed between graphene grains while forming graphene, thereby simplifying the manufacturing process.

Next, electronic devices to which an interconnect structure including a graphene-metal barrier according to an embodiment is applied will be described.

Figure 6:
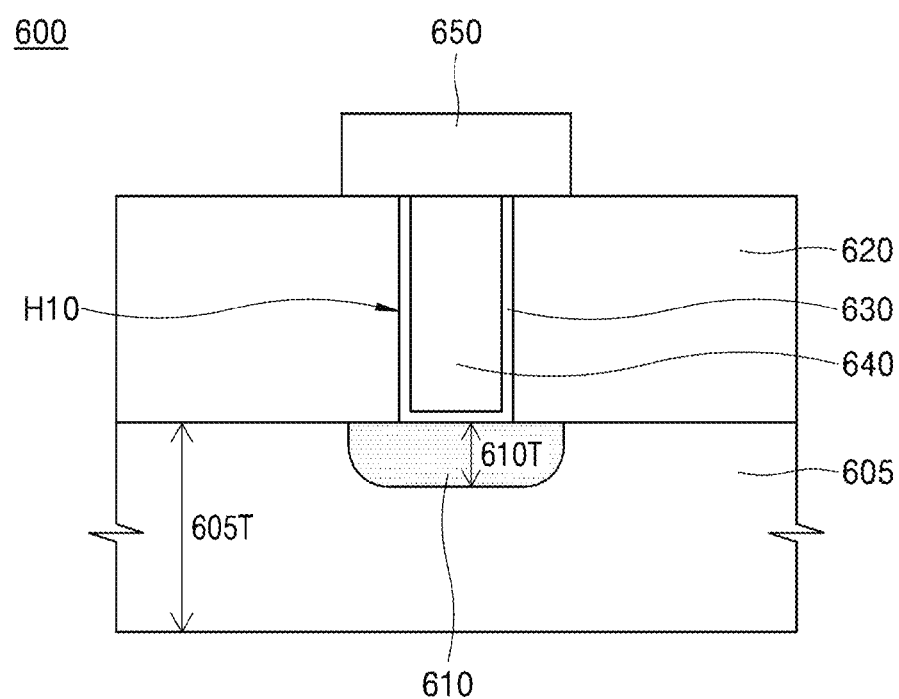
FIG. 6 is a cross-sectional view of a first electronic device including a graphene-metal barrier according to an embodiment.

FIG. 6 shows a first electronic device 600 to which an interconnect structure including a graphene-metal barrier according to an embodiment is applied.

Referring to FIG. 6, the first electronic device 600 may include a device portion 605 having a semiconductor region 610. The device portion 605 having the semiconductor region 610 may be collectively referred to as a lower structure. The device portion 605 may be referred to as a substrate having the semiconductor region 610. The device portion 605 may be part of a circuit of a semiconductor device. In one example, the device portion 605 may include a logic circuit, a memory circuit, and an image sensor circuit. The semiconductor region 610 may be a region doped with a conductive impurity. The semiconductor region 610 is downwardly formed at a given depth starting from a corresponding surface of the device portion 605. The semiconductor region 610 has a thickness 610T less than a thickness 605T of the device portion 605. An insulating layer 620 is present on the device portion 605. The insulating layer 620 may directly contact an upper surface of the device portion 605. The insulating layer 620 may cover an entire upper surface of the device portion 605 except for a part of the semiconductor region 610. The insulating layer 620 includes a hole H10. The semiconductor region 610 may be exposed through the hole H10. The hole H10 may be located on the semiconductor region 610. A portion of the semiconductor region 610 exposed through the hole H10 is covered with a barrier 630. The barrier 630 may directly contact the exposed portion of the semiconductor region 610. The barrier 630 extends on a side surface inside the hole H10. The barrier 630 may cover an entire inner side surface of the hole H10. The barrier 630 may be in direct contact with the entire inner side surface of the hole H10. A thickness of the barrier 630 in a direction perpendicular to the surface of the hole H10 on which the barrier 630 is formed is less than a depth or width of the hole H10. The hole H10, the inner side thereof is covered with the barrier 630, is filled with a conductive plug or a contact structure 640. The hole H10 is completely filled with the contact structure 640. Accordingly, the contact structure 640 has a shape in which bottom and side surfaces of the contact structure 640 are completely covered with the barrier 630. The barrier 630 may be a layer including the graphene-metal barrier described with reference to FIGS. 1 to 3. The insulating layer 620, the barrier 630, and the contact structure 640 may constitute the interconnect structure including the graphene-metal barrier described with reference to FIGS. 1 to 3. Also, the semiconductor region 610, the barrier 630, and the contact structure 640 may also be the interconnect structure including the graphene-metal barrier described with reference to FIGS. 1 to 3. An electrode layer 650 is provided on the insulating layer 620. The electrode layer 650 may be provided to cover the entire hole H10. Accordingly, the contact structure 640 and the barrier 630 may be covered by the electrode layer 650. The electrode layer 650 may directly contact the insulating layer 620, the contact structure 640, and the barrier 630.

Figure 7:
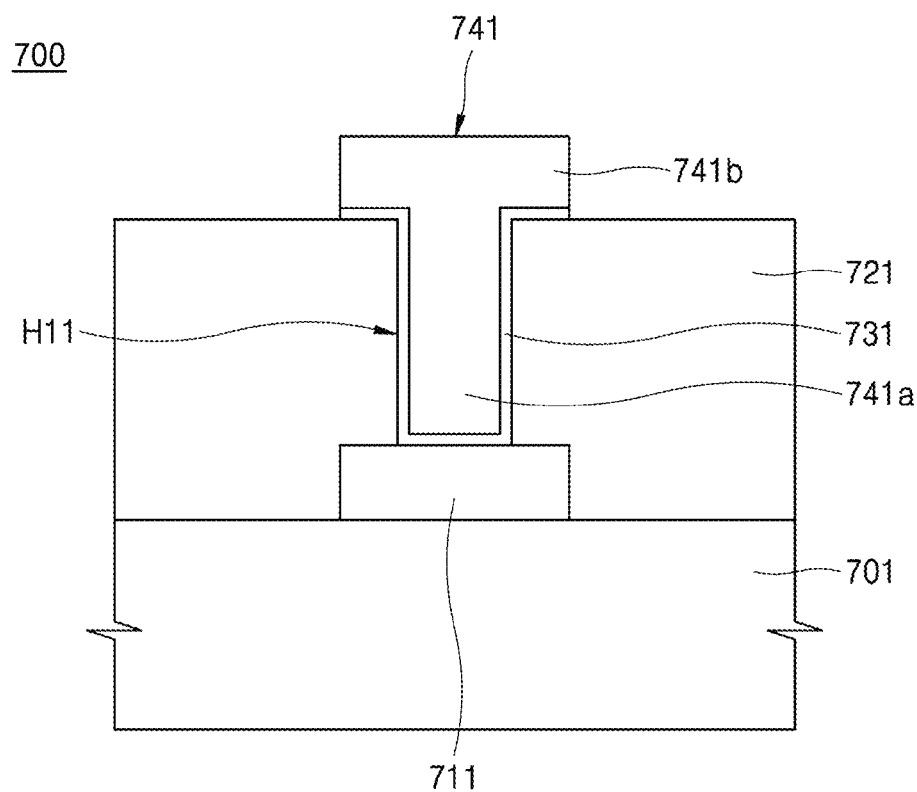
FIG. 7 is a cross-sectional view of a second electronic device including a graphene-metal barrier according to an embodiment.

FIG. 7 shows a second electronic device 700 to which an interconnect structure including a graphene-metal barrier according to an embodiment is applied.

Referring to FIG. 7, the second electronic device 700 includes an understructure 701. For example, the understructure 701 may be a substrate functioning as a supporter. As another example, the understructure 701 may include a device or a part of the device. A material layer 711 is formed on the understructure 701. The understructure 701 and the material layer 711 may be collectively referred to as a lower structure. The material layer 711 may be disposed on a portion of an upper surface of the understructure 701. The material layer 711 may be in direct contact with the understructure 701. The material layer 711 may have conductivity. As an example, the material layer 711 may be a wiring layer or an electrode layer. As another example, the material layer 711 may be part of a device portion including a circuit. An insulating layer 721 covering the material layer 711 is formed on the understructure 701. The insulating layer 721 may cover both side surfaces and a portion of an upper surface of the material layer 711. The insulating layer 721 includes a hole H11 exposing a portion of an upper surface of the material layer 711. The rest of the material layer 711 except for the portion exposed through the hole H11 is covered with the insulating layer 721. An inner side surface of the hole H11 and the upper surface of the material layer 711 exposed through the hole H11 are covered with a barrier 731. The barrier 731 may be in direct contact with an entire inner side surface of the hole H11. The barrier 731 may directly contact an entire upper surface of the material layer 711 exposed through the hole H11. The barrier 731 extends on an upper surface of the insulating layer 721 around the hole H11. The configuration, material, and thickness of the barrier 731 may be the same as the barrier 630 of the first electronic device 600. The hole H11, the inner side surface is covered with the barrier 731, is filled with a contact structure 741. The contact structure 741 extends over the insulating layer 721 around the hole H11. An extended portion 741b of the contact structure 741 is on the barrier 731 extended onto the insulating layer 721 around the hole H11. Bottom and side surfaces of the portion 741a of the contact structure 741 that fills the hole H11 are completely surrounded by the barrier 731.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An interconnect structure comprising:
   a substrate;
   a graphene-metal barrier on the substrate, the graphene-metal barrier including a plurality of graphene layers and metal particles on a grain boundary of each of the plurality of graphene layers and between the plurality of graphene layers; and
   a conductive layer on the graphene-metal barrier, wherein the metal particles are formed at a ratio of 1 atom % to 10 atom % with respect to carbon of the plurality of graphene layers.

2. The interconnect structure of claim 1, wherein the substrate includes a semiconductor and an insulator.

3. The interconnect structure of claim 1, wherein the plurality of graphene layers includes three to ten graphene layers.

4. The interconnect structure of claim 1, wherein the metal particles include Ru, Al, Ti, Pt, Ta, Rh, Ir, or Co.

5. The interconnect structure of claim 4, wherein the metal particles include Ti or Ta, and the metal particles are metal carbides bound with carbon of at least one of the plurality of graphene layers between grain boundaries.

6. The interconnect structure of claim 1, further comprising:
   other metal particles between the substrate and the plurality of graphene layers and between the plurality of graphene layers and the conductive layer.

7. A method of manufacturing an interconnect structure including a graphene-metal barrier, the method comprising:
   forming the graphene-metal barrier on a substrate, the forming the graphene- metal barrier including supplying a hydrocarbon gas and a metal precursor to the substrate, the graphene-metal barrier including a plurality of graphene layers and metal particles on a grain boundary of each of the plurality of graphene layers and between the plurality of graphene layers; and
   forming a conductive layer on the graphene-metal barrier, wherein the metal particles are formed at a ratio of 1 atom % to 10 atom % with respect to carbon of the plurality of graphene layers.

8. The method of claim 7, wherein the metal precursor includes Ru, Al, Ti, Pt, Ta, Pt, Ta, Rh, Ir, or Co.

9. The method of claim 7, wherein the forming the graphene-metal barrier includes simultaneously supplying the hydrocarbon gas and the metal precursor to the substrate.

10. The method of claim 7, wherein the forming the graphene-metal barrier includes repeatedly performing operations of alternately supplying the hydrocarbon gas and the metal precursor to the substrate.

11. The method of claim 7, wherein
    the forming the graphene-metal barrier includes forming a first graphene layer including a plurality of graphene islands and forming metal particles on graphene grain boundaries of the first graphene layer, and
    the forming the graphene-metal barrier further includes forming a second graphene layer including a plurality of graphene islands over the first graphene layer, wherein
    the forming the first graphene layer and the forming the second graphene layer include supplying the hydrocarbon gas to the substrate,
    the forming metal particles on graphene grain boundaries of the first graphene layer includes supplying the metal precursor to the substrate,
    the metal particles on the graphene grain boundaries of the first graphene layer act as catalysts for growing the plurality of graphene islands of the second graphene layer,
    the plurality of graphene layers include the first graphene layer and the second graphene layer, and the metal particles are formed between graphene grains in the first graphene layer and the second graphene layer.

12. The method of claim 11, wherein
    the metal precursor includes Ti and Ta, and
    the metal particles include TiC and TaC metal carbide combined with carbon of a corresponding graphene layer among the plurality of graphene layers.

13. The method of claim 7, wherein the plurality of graphene layers include three to ten graphene layers.

14. The method of claim 7, wherein the forming the graphene-metal barrier includes:
    forming a structure including the plurality of graphene layers and the metal particles between the plurality of graphene layers; and
    moving some of the metal particles between the plurality of graphene layers to a grain boundary of the plurality of graphene layer by annealing the structure before forming the conductive layer, wherein some of the metal particles cover the grain boundary of plurality of graphene layers.

15. The method of claim 7, wherein the forming the graphene-metal barrier includes forming the metal particles between the substrate and the plurality of graphene layers and between a corresponding one of the plurality of graphene layers and the conductive layer.

16. The method of claim 14, wherein the graphene- metal barrier is formed using a chemical vapor deposition (CVD) process.

17. The method of claim 15, wherein the graphene- metal barrier is formed using a plasma-enhanced chemical vapor deposition (PECVD) process.

18. An interconnect structure comprising:
    a substrate;
    a conductive layer on the substrate; and
    a graphene-metal barrier between the conductive layer and the substrate, the graphene-metal barrier including a plurality of graphene layers arranged on each other and metal particles, each of the plurality of graphene layers including grains separated by grain boundaries, and a first portion of the metal particles being on or in corresponding grain boundaries among the grain boundaries of at least two of the plurality of graphene layers, wherein the metal particles are formed at a ratio of 1 atom % to 10 atom % with respect to carbon of the plurality of graphene layers.

19. The interconnect structure of claim 18, wherein a second portion of the metal particles are between adjacent graphene layers among the plurality of graphene layers.

20. An electronic device comprising:

an understructure;

a barrier on the understructure; and a contact structure on the barrier, wherein the barrier is the graphene-metal barrier described in claim 18.

\* \* \* \* \*